(12) United States Patent
Ivry

(10) Patent No.: US 11,757,682 B1
(45) Date of Patent: Sep. 12, 2023

(54) GENERATION OF TRELLIS-CODED MODULATION SCHEMES

(71) Applicant: MELLANOX TECHNOLOGIES, LTD., Yokneam (IL)

(72) Inventor: Raanan Ivry, Caesarea (IL)

(73) Assignee: MELLANOX TECHNOLOGIES, LTD., Yokneam (IL)

( * ) Notice: Subject to any disclaimer, the term of this patent is extended or adjusted under 35 U.S.C. 154(b) by 0 days.

(21) Appl. No.: 17/731,268

(22) Filed: Apr. 28, 2022

(51) Int. Cl.
| | |
|---|---|
| H04L 27/04 | (2006.01) |
| H04L 25/03 | (2006.01) |
| H04B 1/04 | (2006.01) |
| H04L 27/36 | (2006.01) |
| H04L 27/20 | (2006.01) |

(52) U.S. Cl.
CPC ......... *H04L 25/03203* (2013.01); *H04B 1/04* (2013.01); *H04L 27/04* (2013.01); *H04L 27/20* (2013.01); *H04L 27/36* (2013.01)

(58) Field of Classification Search
CPC ........ H03M 7/00; H03M 13/00; H03M 13/03; H04B 1/04; H04L 5/12; H04L 23/02; H04L 25/00; H04L 25/03203; H04L 27/04; H04L 27/06; H04L 27/20; H04L 27/36
USPC ........ 375/219, 265, 295, 341, 362; 714/786, 714/792, 795
See application file for complete search history.

(56) References Cited

U.S. PATENT DOCUMENTS 8,599,959 B2 * 12/2013 Krachkovsky ........ H04L 1/0042
375/295

OTHER PUBLICATIONS

Gorlov et al. "Improving Energy Efficiency of Partial Response Signals by using Coded Modulation" Aug. 2015 (Year: 2015).*

(Continued)

*Primary Examiner* — Shawkat M Ali
(74) *Attorney, Agent, or Firm* — KLIGLER & ASSOCIATES PATENT ATTORNEYS LTD

(57) ABSTRACT

A method for generating a Trellis-Coded Modulation (TCM) scheme for transmitting symbols over a Partial-Response (PR) channel, the method including holding a base TCM scheme including a plurality of states and transitions among the states. Sequences of symbols are produced, and second sequences of symbols are calculated, each second sequence emulating a response of the PR channel to a respective sequence of symbols traversing the PR channel. The TCM scheme is initialized by assigning the sequences to the transitions of the base TCM scheme. One or more transitions are removed so that second sequences corresponding to transitions that were not removed are separated by at least a first distance. One or more additional transitions are further removed from the TCM scheme, so that second sequences corresponding to parallel transitions from a current state to a next state are separated by at least a second distance larger than the first distance.

21 Claims, 3 Drawing Sheets

(56) References Cited

OTHER PUBLICATIONS

Lou et al. "A Programmable Codec Design for Trellis Coded Modulation" Nov. 1997 (Year: 1997).*
Hole et al. "Improved Coding Techniques for Precoded Partial-Response Channels" Mar. 1994 (Year: 1994).*
Wolf et al., "Trellis Coding for Partial-Response Channels," IEEE Transactions on Communications, vol. 34, issue 8, pp. 765-773, Aug. 1986.
Haeb, "A Modified Trellis Coding Technique for Partial Response Channels," IEEE Transactions on Communications, vol. 40, No. 3, pp. 513-520, Mar. 1992.
Fredrickson et al., "Improved Trellis-Coding for Partial-Response Channels," IEEE Transactions on Magnetics, vol. 31, No. 2, pp. 1141-1148, Mar. 1995.

* cited by examiner

GENERATION OF TRELLIS-CODED MODULATION SCHEMES

TECHNICAL FIELD

Embodiments described herein relate generally to data communication, and particularly to methods and systems for generating Trellis-coded modulation schemes.

BACKGROUND

Trellis-coded modulation is an encoding technique designed for efficient data transmission over band-limited channels. Trellis-coded modulation achieves high bandwidth efficiency by combining data encoding and modulation techniques.

Various types of communication channels, e.g., partial-response channels, may cause Inter Symbol Interference (ISI) at the receiver side. Trellis-coded modulation schemes suitable for partial-response channels are known in the art. For example, a paper entitled "Trellis Coding for Partial-Response Channels," published in the IEEE Transactions on Communications, Volume 34, Issue 8, August 1986, describes trellis-coding techniques for improving the reliability of digital transmission over noisy partial-response channels. Such channels are commonly encountered in digital communication systems, and also play a role in devices for data recording. The authors study methods to obtain codes which increase free Euclidean distance between permitted sequences of channel outputs and avoid the occurrence of unlimited runs of identical outputs at the expense of some loss in data rate.

SUMMARY

An embodiment that is described herein provides a method for generating a Trellis-Coded Modulation (TCM) scheme for transmitting symbols over a Partial-Response (PR) channel, the method including holding a base TCM scheme including a plurality of states and transitions among the states. Multiple sequences of symbols are produced, and respective second sequences of symbols are calculated, each second sequence of symbols emulating a response of the PR channel to a respective sequence of symbols traversing the PR channel. The TCM scheme is initialized by assigning the sequences of symbols to the transitions of the base TCM scheme. One or more of the transitions from the TCM scheme are removed so that second sequences of symbols corresponding to transitions that were not removed are separated by at least a specified first distance. One or more additional transitions are further removed from among the transitions of the TCM scheme, so that second sequences of symbols corresponding to parallel transitions from a current state to a next state are separated by at least a specified second distance larger than the first distance.

In some embodiments, holding the base TCM scheme includes selecting a number of the states in the plurality of states based on an underlying modulation scheme and on a memory length parameter of the channel. In other embodiments, producing the sequences of symbols includes producing the sequences of symbols having a predefined number of symbols that is equal to or larger than a memory length parameter of the channel. In yet other embodiments, producing the sequences of symbols includes producing the sequences of symbols having symbols of a modulation scheme selected from a list including: a Pulse Amplitude Modulation (PAM) scheme, a Quadrature Amplitude Modulation (QAM) scheme, and a Phase-shift keying (PSK) scheme.

In an embodiment, calculating the first distance and the second distance includes calculating a Euclidian distance accumulated over individual symbols of relevant second sequences. In another embodiment, removing the additional transitions includes identifying sequences of symbols associated with parallel transitions from a given current state to a given next state, and removing one or more transitions corresponding to the identified sequences of symbols. In yet another embodiment, identifying the sequences of symbols includes identifying second sequences of symbols sharing a same initial subsequence of symbols indicative of the given current state, and a same subsequence of last symbols indicative of the given next state.

In some embodiments, the method further includes, including in the TCM scheme one or more additional states and multiple additional transitions, each additional transition satisfying one or both of following conditions: (i) the additional transition being egressed from one of the states or from an additional state, and (ii) the additional transition being ended at one of the states or at an additional state. In other embodiments, the method further includes assigning to the additional transitions sequences of symbols associated with transitions that have been removed, so that the second sequences of symbols corresponding to non-parallel additional transitions and to parallel additional transitions are separated by at least the first distance and the second distance, respectively. In yet other embodiments, the method further includes determining a number of input bits to be assigned per transition, based on a minimal number among numbers of egressing transitions from respective states of the TCM scheme.

There is additionally provided, in accordance with an embodiment that is described herein, an apparatus for generating a Trellis-Coded Modulation (TCM) scheme for transmitting symbols over a Partial-Response (PR) channel, the apparatus including a memory and a processor. The memory is configured to hold a base TCM scheme including a plurality of states and transitions among the states. The processor is configured to produce multiple sequences of symbols, and calculate respective second sequences of symbols, each second sequence of symbols emulating a response of the PR channel to a respective sequence of symbols traversing the PR channel, to initialize the TCM scheme, in the memory, by assigning the sequences of symbols to the transitions of the base TCM scheme, to remove one or more of the transitions from the TCM scheme so that second sequences of symbols corresponding to transitions that were not removed are separated by at least a specified first distance, and to further remove, from among the transitions of the TCM scheme, one or more additional transitions, so that second sequences of symbols corresponding to parallel transitions from a current state to a next state are separated by at least a specified second distance larger than the first distance.

There is additionally provided, in accordance with an embodiment that is described herein, a computer software product, the product including a tangible non-transitory computer-readable medium in which program instructions are stored, which instructions, when read by a processor of a computing system, cause the processor to hold in a memory of the computing system a base TCM scheme including a plurality of states and transitions among the states, to produce multiple sequences of symbols, and calculate respective second sequences of symbols, each second sequence of symbols emulating a response of the PR channel to a respective sequence of symbols traversing the PR channel, to initialize the TCM scheme, in the memory, by assigning the sequences of symbols to the transitions of the base TCM scheme, to remove one or more of the transitions from the TCM scheme so that second sequences of symbols corresponding to transitions that were not removed are separated by at least a specified first distance, and to further remove, from among the transitions of the TCM scheme, one or more additional transitions, so that second sequences of symbols corresponding to parallel transitions from a current state to a next state are separated by at least a specified second distance larger than the first distance.

These and other embodiments will be more fully understood from the following detailed description of the embodiments thereof, taken together with the drawings in which:

DETAILED DESCRIPTION OF EMBODIMENTS

Overview

Figure 1:
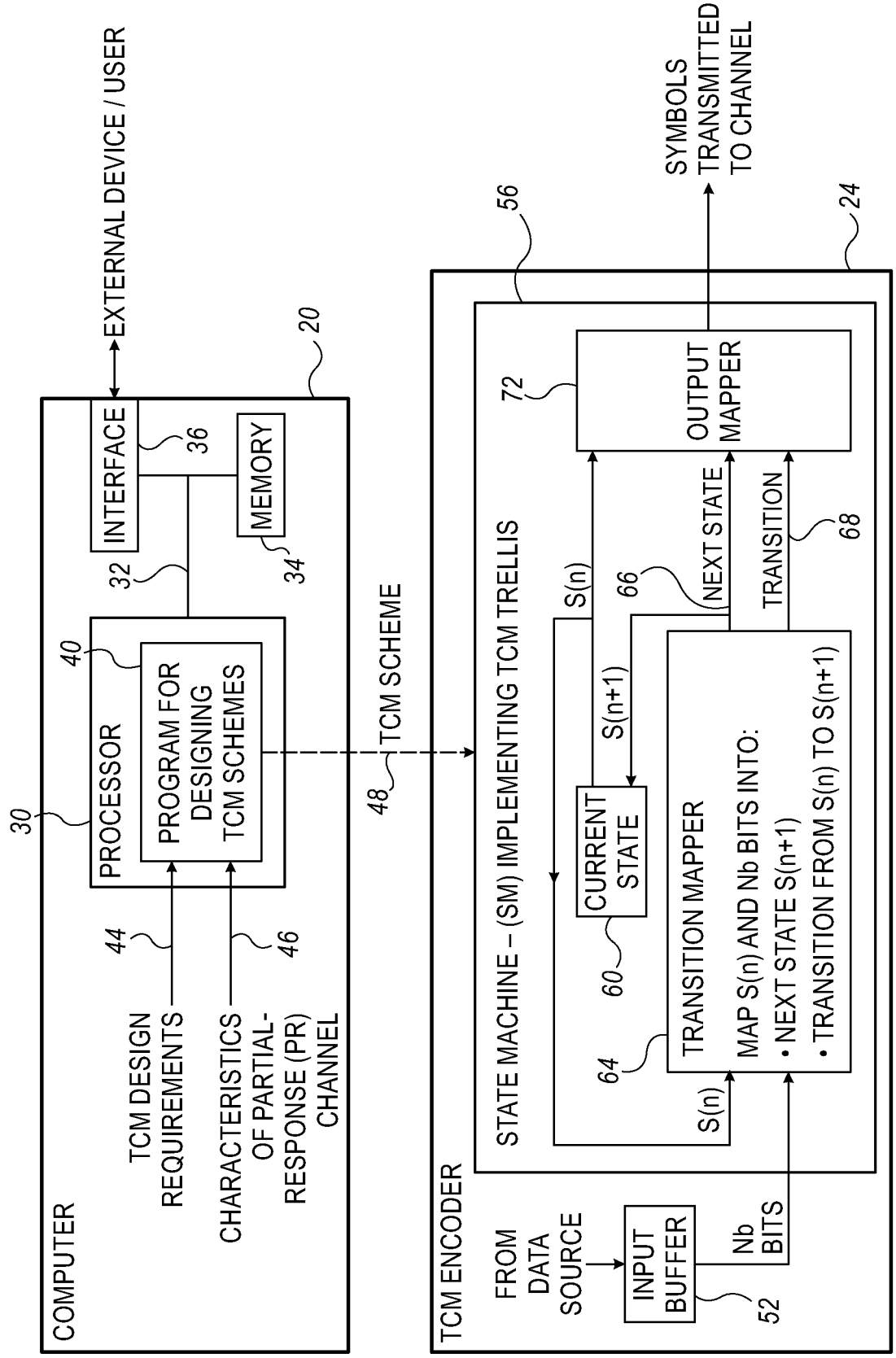
FIG. 1 is a block diagram that schematically illustrates a computer generating Trellis-Coded Modulation (TCM) schemes, and a TCM encoder implemented based on a TCM scheme generated by the computer, in accordance with an embodiment that is described herein.

Embodiments that are described herein provide methods and systems for computer-based generation of Trellis-Coded Modulation (TCM) schemes suitable for Partial-Response (PR) channels. The generated TCM schemes produce sequences of symbols that are distant from one another for achieving best reception performance under specified requirements.

A TCM-based data encoder may be implemented based on a TCM scheme comprising multiple states and transitions among the states. Upon state transition, the TCM scheme produces a respective sequence of symbols, referred to herein as an "X-sequence." The symbols in the X-sequences, also referred to herein as "X-symbols," carry the data being transmitted. The description that follows refers mainly to X-sequences whose symbols belong to a Pulse Amplitude Modulation (PAM) scheme. Using PAM, however, is not mandatory, and other suitable modulation schemes such as Quadrature Amplitude Modulation (QAM) and Phase-shift keying (PSK) can also be used.

The TCM encoder transmits the X-sequences over the channel, which produces respective sequences of symbols, referred to herein as "Y-sequences." The symbols in a Y-sequence are also referred to herein as "Y-symbols." The receiver recovers the transmitted data, by recovering the X-sequences from the received Y-sequences. To this end, the receiver may use any suitable decoding method, e.g., Viterbi decoding. Reception performance at the receiver typically depends on the minimal distance among the Y-sequences, so that a large distance results in high reception performance, and vice versa. Receiver performance may be measured in terms of bit error rate or symbol error rate, for example.

In the present context and in the claims, the term "PR channel" refers to a communication channel causing Inter Symbol Interference (ISI) having a specified structure. For example, in reading data recorded on a magnetic media, partial response means that the channel response to an individual bit may be spread over multiple sampling instants.

A PR channel is sometimes modeled using a Trellis diagram. Assuming PAM symbols of K levels (PAM-K), the number of states in the Trellis diagram is given by $K^M$. Moreover, the Trellis diagram of the PR channel has a number K of transitions egressing from each current state to respective next states in the Trellis diagram.

Upon state transition, the PR channel produces a Y-symbol depending on the current X-symbol and on a number M of previous X-symbols, wherein 'M' denotes a memory length parameter of the PR channel. A PR channel having a memory length parameter M is sometimes referred to as a "PR-M" channel. The impulse response function of a PR channel may be characterized by a suitable digital Finite Impulse Response (FIR) filter having M+1 taps. The taps (or coefficients) may get any suitable values such as integer or non-integer values. Example FIR functions given by F1=[1, 1] and F2=[1, 2, 1] correspond to PR channels with M=1 and M=2, respectively. PR channels with FIR functions [1, 1] and [1, −1] may be used, for example, in data recording applications.

Using the above terminology, a Trellis diagram modeling a PR-1 channel (M=1) with PAM-4 symbols (K=4) has four states ($K^M=4^1=4$), and four transitions egressing from each of the four current states.

In the disclosed embodiments, a computer program generates TCM schemes for data transmission over PR channels. The generation of the TCM scheme depends, for example, on characteristics of the PR channel, underlying PAM scheme, the number of symbols transmitted upon state transition, and distance requirements among sequences of symbols output by the PR channel.

Consider an embodiment implementing a method for generating a TCM scheme for transmitting symbols over a PR channel. The method includes holding a base TCM scheme including a plurality of states and transitions among the states. Multiple sequences of data symbols (also referred to herein as "X-sequences of symbols") are produced, and respective second sequences of symbols corresponding to the data symbols after traversing the channel (also referred to herein as "Y-sequences of symbols") are calculated. Each Y-sequence of symbols emulating the response of the PR channel to a respective X-sequence of symbols traversing the PR channel. The TCM scheme is initialized by assigning the X-sequences to the transitions of the base TCM scheme. One or more of the transitions are removed from the TCM scheme so that Y-sequences corresponding to transitions that were not removed are separated by at least a specified first distance (D1). One or more additional transitions are further removed from among the transitions of the TCM scheme, so that Y-sequences corresponding to parallel transitions from a current state to a next state are separated by at least a specified second distance (D2) larger than the first distance. The TCM scheme is output, e.g., to be used in a TCM encoder.

In some embodiments, the number of states in the TCM scheme is determined based on an underlying modulation scheme and on the memory length parameter of the channel. In an embodiment, the X-sequences are produced having a predefined number (N) of symbols that is equal to or larger than the memory length parameter (M) of the channel. In an embodiment, the X-sequences are produced with symbols of a PAM scheme.

The distance between Y-sequences may be calculated in various ways. In some embodiments, the distance separating between the Y-sequences of symbols (e.g., the first and second distances above) is calculated by calculating a Euclidian distance accumulated over individual symbols of the Y-sequences.

In some embodiments, removing the additional transitions includes identifying Y-sequences of symbols associated with parallel transitions from a given current state to a given next state, and removing one or more transitions corresponding to the identified Y-sequences of symbols. In an embodiment, the Y-sequences of symbols are identified by identifying Y-sequences of symbols sharing a same initial subsequence of symbols indicative of the given current state, and a same subsequence of last symbols indicative of the given next state.

In some embodiments, the number of transitions in the TCM scheme may be increased, e.g., for increasing the number of bits assigned to the transitions. In one such embodiment, one or more additional states and multiple additional transitions are included in the TCM scheme, each additional transition satisfying one or both of the following conditions: (i) the additional transition being egressed from one of the states or from an additional state, and (ii) the additional transition being ended at one of the states or at an additional state.

The additional transitions are assigned X-sequences of symbols associated with transitions that have been removed, so that the Y-sequences of symbols corresponding to non-parallel additional transitions and to parallel additional transitions are separated by at least the first distance and the second distance, respectively.

In some embodiments, the method further includes assigning input bits to state transitions in the TCM scheme. To this end, some of the transitions are removed from the TCM scheme so that the states in the TCM scheme share a common number of egressing transitions per state. In such embodiments, the number of input bits to be assigned per transition is determined, based on a minimal number among numbers of egressing transitions from respective states of the TCM scheme.

In the disclosed techniques, a computer program automatically generates a TCM scheme, or a family of TCM schemes, for one or more PR channels. The program flexibly generates the TCM schemes based on specified parameters and requirements. By imposing distance requirements among symbol sequences at the PR channel output, reception performance at the receiver can be controlled. At least some of the TCM schemes generated using the disclosed embodiments, are very hard or even impossible to generate using conventional approaches.

System Description

FIG. 1 is a block diagram that schematically illustrates a computer 20 generating Trellis-Coded Modulation (TCM) schemes, and a TCM encoder 24 implemented based on a TCM scheme 48 generated by the computer, in accordance with an embodiment that is described herein.

Computer 20 comprises a processor 30 coupled via a suitable bus 32 to a memory 34 and an interface 36. Processor 30 runs a computer program 40, configured to generate TCM schemes for data transmission over PR channels. In an embodiment, program 40 may be stored in memory 34 and executed by processor 30. Memory 34 may store design requirements and parameters that program 40 may use in generating the TCM schemes. Memory 34 may further store temporary data and computational results that program 40 produces during execution. Processor 30 may communicate with other devices and/or with a user via interface 36. For example, interface 36 enables interactive operation between processor 30 and an external entity, e.g., a human user or device (not shown).

In some embodiments, processor 30 receives (e.g., via interface 36) TCM design requirements 44 and PR channel characteristics 46. Requirements 44 and channel characteristics 46 are input to program 40 and control the program's operation. Processor 30 may also output, via interface 36, a TCM scheme generated by program 40.

In the example of FIG. 1, TCM encoder 24 is implemented based on a TCM scheme 48 generated by computer 20. TCM scheme 48 specifies a group of states, allowed transitions from current to next states, mapping information for determining next state and sequences of symbols to be transmitted upon state transition, and the like.

TCM encoder 24 comprises an input buffer 52 and a State Machine (SM) 56 implementing TCM scheme 48. Input buffer 52 temporarily stores data (e.g., bits) pending transmission. The input buffer is filled by a data source (not shown) and emptied by SM 56, e.g., in chunks of Nb bits.

SM 56 comprises a current state 60 selected from among the group of states specified in TCM scheme 48. In the description that follows, the current and next states at discrete respective time instances 'n' and 'n+1' are denoted S(n) and S(n+1), respectively.

SM 56 comprises a transition mapper 64, which receives the current state S(n) and a chunk of Nb input bits from input buffer 52. Based on mapping information specified in TCM scheme 48, transition mapper 64 maps S(n) and the Nb bits to a next state 66 S(n+1) and a state transition 68. In some embodiments transition 68 corresponds to a transition selected from among multiple parallel transitions specified in TCM scheme 48 from current state S(n) to next state S(n+1).

In the present context and in the claims, the term "parallel transitions" refers to two or more transitions that are egressing from a common current state and end at a common next state. The term "non-parallel transitions" refers to transitions having different respective current states, next states, or both.

SM 56 further comprises an output mapper 72, which based on mapping information in TCM scheme 48 maps S(n), S(n+1) and transition 68, to a respective X-sequence of symbols. TCM encoder 24 transmits the X-sequences of symbols produced by SM 56 to the PR channel.

In some embodiments, design requirements 44 specify a length 'N' of the X-sequences. The selection of N presents a tradeoff between performance and complexity of the receiver as described herein. On one hand, long X-sequences (large N) may be desirable for achieving Y-sequences separated from one another by large distances, thereby resulting in high performance at the receiver. On the other hand, however, large N value typically results in a high-complexity receiver.

The configurations of computer 20 and TCM encoder 24 in FIG. 1 are example configurations, which are chosen purely for the sake of conceptual clarity. In alternative embodiments, any other suitable computer and TCM encoder configurations can also be used. Elements that are not necessary for understanding the principles of the present invention, such as various interfaces, addressing circuits, timing and sequencing circuits and debugging circuits, have been omitted from the figure for clarity.

Some elements of TCM encoder 24 such as SM 56 may be implemented in hardware, e.g., in one or more Application-Specific Integrated Circuits (ASICs) or FPGAs. Additionally or alternatively, SM 56 can be implemented using software, or using a combination of hardware and software elements.

Memory 34 may comprise any suitable storage element such as, for example, a Random-Access Memory (RAM), or a Nonvolatile (NVM) memory such as a Flash memory device. In some embodiments, memory 34 comprises multiple storage elements of various storage types.

In some embodiments, some of the functions of computer 20 and TCM encoder 24 may be carried out by respective general-purpose processors (e.g., processor 30 in case of computer 20), which are programmed in software to carry out the functions described herein. The software may be downloaded to the processors in electronic form, over a network, for example, or it may, alternatively or additionally, be provided and/or stored on non-transitory tangible media, such as magnetic, optical, or electronic memory.

Methods for Generating TCM Schemes for PR Channels

Figure 2:
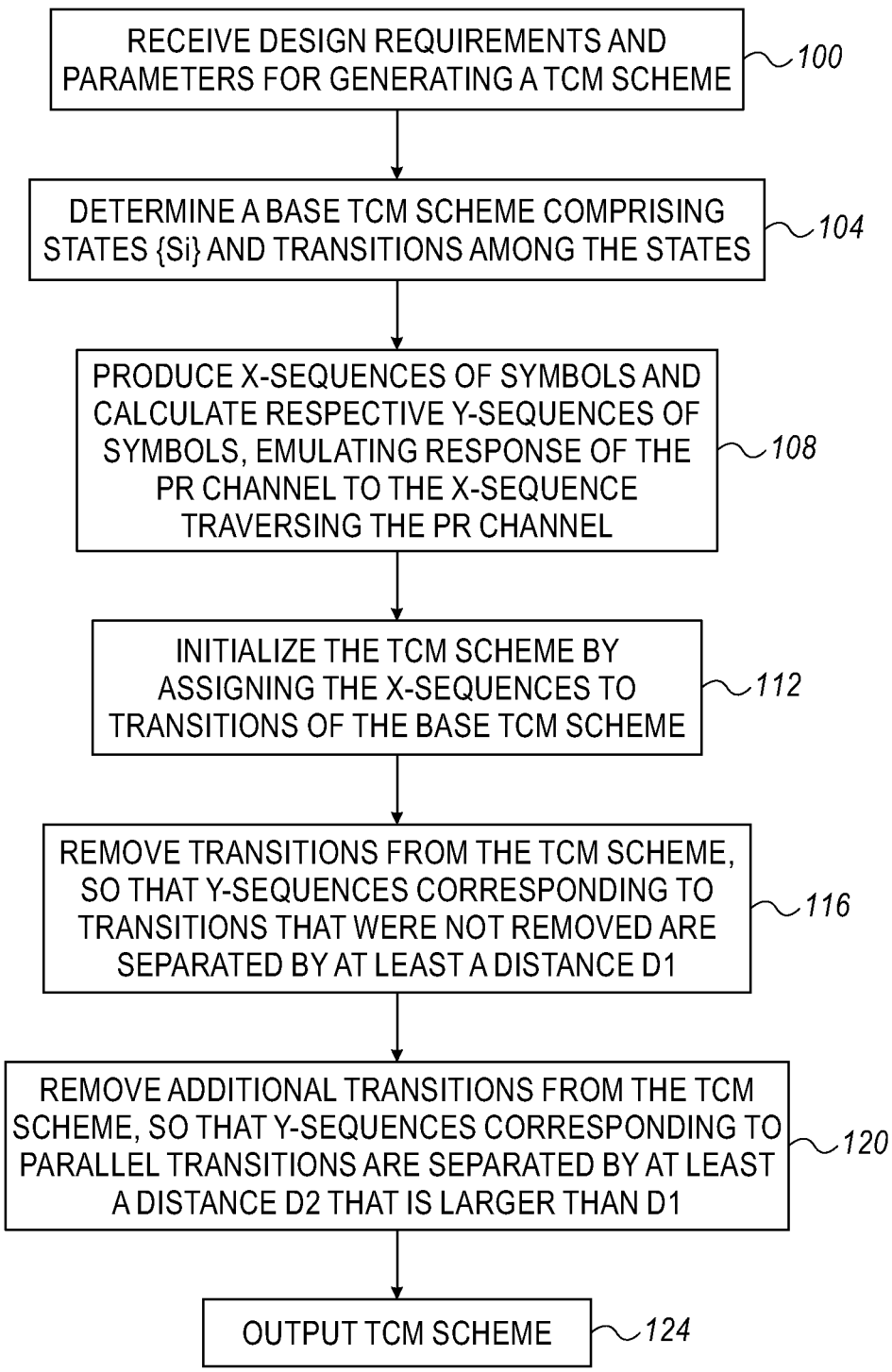
FIG. 2 is a flow chart that schematically illustrates a method for generating a TCM scheme for a Partial-Response (PR) channel, in accordance with an embodiment that is described herein.

FIG. 2 is a flow chart that schematically illustrates a method for generating a TCM scheme for a Partial-Response (PR) channel, in accordance with an embodiment that is described herein. The method will be described as executed by processor 30 of computer 20 of FIG. 1.

The method begins at an input step 100, with processor 30 receiving (e.g., via interface 36) design requirements and parameters for generating a TCM scheme.

The design requirements and parameters comprise, for example, characteristics of the underlying PR channel such as the impulse response function and memory length parameter (M) of the PR channel, the length N of X-sequences to be transmitted upon state transition, and the dimension (K) of the underlying PAM scheme. In an embodiment, the design requirements specify distance requirements among Y-sequences output by the PR channel, which determine the receiver performance. The distance requirements specify e.g., a minimal distance D1 among non-parallel Y-sequences and a minimal distance D2 among parallel Y-sequences. As will be described below, in some embodiments the distances D1 and D2 satisfy a condition D2>D1.

At a scheme initialization step 104, the processor determines, based on the design requirements and parameters, a base TCM scheme comprising a group of states {Si} and transitions among the states. In some embodiments, instead of determining the base TCM scheme, the processor receives the base TCM scheme, e.g., via interface 36.

In some embodiments, the base TCM scheme comprises a number Ns of states given by $Ns=K^M$, and the number of state transitions given by $Ns^2=K^{2M}$ (K being the number of PAM levels, and M being the memory length parameter of the PR channel). Alternatively, the base TCM scheme may comprise partial subsets of the entire states (e.g., less than $K^M$ states) and/or state transitions.

As will be described below, processor 30 initializes the TCM scheme by assigning X-sequences to transitions in the base TCM scheme, and removes some of the transitions in the TCM scheme for improving separation among Y-sequences.

At a sequence generation step 108, processor 30 generates X-sequences having N symbols, to be assigned to state transitions. The maximal number of X-sequences is given by KN. The processor further produces Y-sequences of symbols corresponding respectively to the X-sequences of symbols, by calculating the response of the PR channel to each of the X-sequences. The calculated Y-sequences thus comprising (N+M) symbols. A Y-sequence can be viewed as emulating the response of the PR channel to a respective X-sequence traversing the PR channel.

It is noted that due to the processing applied to the X-symbols by the impulse response function of the PR channel, the set of symbols in the X-sequences is typically different from the set of symbols in the Y-sequences.

At a scheme initialization step 112, the processor initializes the TCM scheme by assigning the X-sequences to the transitions of the base TCM scheme. In some embodiments, to this end, the processor classifies the X-sequences to subgroups denoted "Aij" that are associated respectively with a current state S(n)=Si and a next state S(n+1)=Sj. X-sequences that were classified to Aij are assigned to parallel transitions from Si to Sj. Moreover, transitions associated with X-sequences classified to different Aij subgroups (having different i, j, or both) are considered non-parallel transitions.

In some embodiments, to classify the X-sequences to a subgroup Aij, the processor identifies Y-sequences sharing (i) a subsequence of initial M symbols in the Y-sequence indicative of Si, and (ii) a subsequence of last M symbols in the Y-sequence, indicative of Sj. The processor classifies to the subgroup Aij, X-sequences corresponding respectively to the Y-sequences identified for Si and Sj.

At a transition removal step 116, processor 30 removes one or more transitions from the TCM scheme, so that Y-sequences corresponding to transitions that were not removed are separated by at least the specified distance D1. At this stage, Y-sequences of both parallel and non-parallel transitions are separated by at least the distance D1.

In classifying the X-sequences of symbols, processor 30 may use any suitable type of a distance measure between the Y-sequences of symbols. In some embodiments, the processor calculates a Euclidian distance (denoted ED) between Y-sequences Y1 and Y2 of length L as given by:

$$ED(Y1, Y2) = \sqrt{\sum_{l=0}^{L-1}(Y1_l - Y2_l)^2} \qquad \text{Equation 1}$$

In Equation 1, $Y1_l$ and $Y2_l$ denote the $l^{th}$ symbols in the Y1 and Y2 sequences, respectively.

At a further transition removal step 120, the processor removes one or more additional transitions from the TCM scheme, so that Y-sequences corresponding to parallel transitions between a common pair of current and next states are separated by at least the specified distance D2 (e.g., D2>D1).

At an output step 124, processor 30 outputs the resulting TCM scheme, and the method terminates.

In some embodiments, the TCM scheme produced by the method of FIG. 2 as described above may be further extended, as described herein. The number of bits (Nb) transmitted upon state transition depends on the number of transitions egressing from current states in the TCM scheme. In some embodiments, processor 30 extends the TCM scheme produced by the method of FIG. 2 by including in the TCM scheme one or more additional states, thereby increasing the number of state transitions egressing from current states in the TCM scheme. In such embodiments, processor 30 assigns X-sequences that were removed at step 112, to the additional state transitions so that Y-sequences corresponding to non-parallel additional transitions are separated by at least the distance D1, and Y-sequences corresponding to parallel additional transitions are separated by at least the distance D2.

Figure 3:
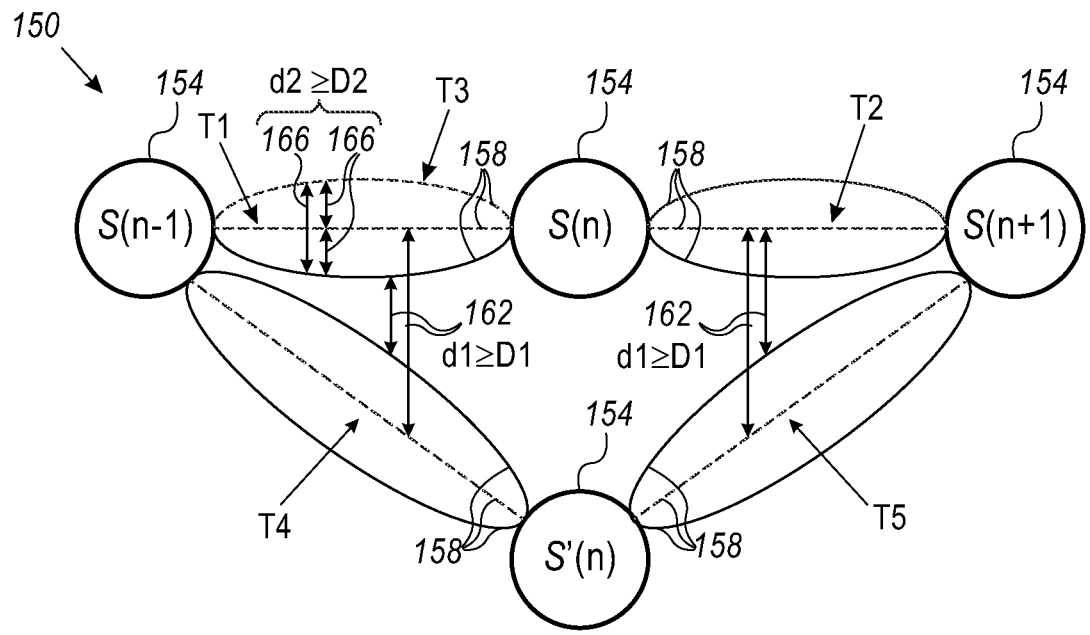
FIG. 3 is a diagram that schematically illustrates selected states in a Trellis diagram having parallel state transitions, in accordance with an embodiment that is described herein.

FIG. 3 is a diagram that schematically illustrates selected states in a Trellis diagram 150 having parallel state transitions, in accordance with an embodiment that is described herein.

The Trellis diagram depicts selected states 154 and state transitions 158 of a TCM scheme. Trellis diagram 150 depicts a state S(n−1) at a time instance (n−1), states S(n) and S'(n) at a time instance (n) and a state S(n+1) at a time instance (n+1). Other states and state transitions are omitted from the diagram for the sake of clarity.

It is assumed that Trellis diagram 150 corresponds to a TCM scheme that was generated using the method of FIG. 2. As such, each transition 158 is assigned a respective X-sequence of symbols, which in turn is associated with a respective Y-sequence of symbols at the output of the PR channel. It is further assumed that the TCM scheme meets the minimal distance requirements D1 and D2 as described above.

In the Trellis diagram of FIG. 3, arrows 162 are indicative of distances d1 (d1≥D1) between Y-sequences corresponding to non-parallel transitions, and arrows 166 are indicative of distances d2 (d2≥D2) between Y-sequences corresponding to parallel transitions. Consider paths in Trellis diagram 150 as depicted in Table 1:

TABLE 1

Example paths in the Trellis diagram

| Path | S(n − 1) -> S(n) | S(n) -> S(n + 1) |
|---|---|---|
| PATH_1 | T1 | T2 |
| PATH_2 | T3 | T2 |
| PATH_3 | T4 | T5 |

The overall distance between PATH_1 and PATH_2 (which both share transition T2) is given by D2+0=D2. The overall distance between PATH_1 (or PATH_2) and PATH_3 is given by $\sqrt{(D1^2+D1^2)}=(\sqrt{2}\cdot D1)$. In some embodiments, to ensure a minimal distance ($\sqrt{2}\cdot D1$) among Y-sequences produced by the TCM scheme, D1 and D2 are selected to satisfy the condition $D2 \geq \sqrt{2}\cdot D1$.

The minimum distance of a coding scheme refers to "the minimum distance among any two unequal sequences of symbols at the channel output. As demonstrated in FIG. 3, the TCM scheme generated by the method of FIG. 2 (and selecting $D2 \geq \sqrt{2}\cdot D1$) has a minimum distance $\sqrt{2}\cdot D1$.

Methods for Assigning Bit-Sequences to State Transitions

In some embodiments, generating a TCM scheme also comprises assigning input bits to state transitions. In describing such assignments, let "Nb" denote the number of input bits used for selecting a transition among multiple transitions egressing from a common current state, and further let "NTi" denote the number of transitions egressing from state Si in the TCM scheme. For example, the number of bits required for selecting among NTi=8 transitions is given by Log 2(8)=3.

Figure 4:
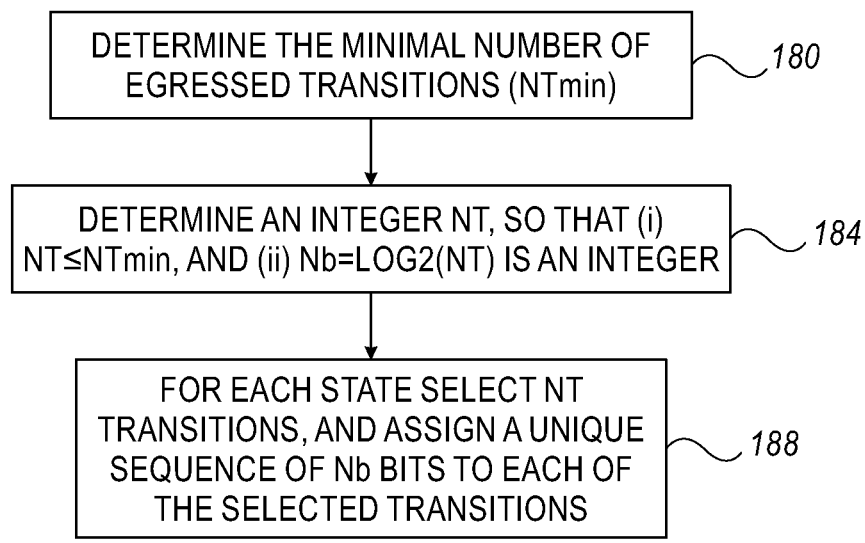
FIG. 4 is a flow chart that schematically illustrates a method for assigning input bits to state transitions in a TCM scheme, in accordance with an embodiment that is described herein.

FIG. 4 is a flow chart that schematically illustrates a method for assigning input bits to state transitions in a TCM scheme, in accordance with an embodiment that is described herein.

The method may be applied to any suitable TCM scheme, e.g., a TCM scheme produced by the method of FIG. 2 above. The method will be described as executed by processor 30 of FIG. 1. Alternatively, the method may be executed by any other processor (not shown).

The method begins with processor 30 determining the minimal number (NTmin) of transitions egressing from a common state in the TCM scheme, at a minimal number determination step 180.

At a number of transitions selection step 184, the processor determines an integer NT satisfying the conditions (i) NT does not exceed NTmin, and (ii) Nb=Log 2(NT) is an integer number.

At an assignment step 188, for each current state in the TCM scheme, the processor selects a number NT of transitions egressing from this state, and removes from the TCM scheme those transitions that were not selected. The processor assigns a unique sequence of Nb bits to each of the NT transitions egressing from each current state in the TCM scheme. At step 188, the processor may select the NT transitions so as to achieve maximal distances among Y-sequences corresponding to the selected transitions. Following step 188 the method terminates.

In some embodiments, input bits are assigned to transitions from S(n) to S(n+p), wherein 'p' is an integer larger than 1. The method of FIG. 4 is similarly applicable in such embodiments, but in this case the method considers all possible transitions from S(n) to S(n+p). For example, for a TCM scheme having NT transitions egressing from each current state, the overall number of transitions from S(n) to S(n+p) is given by $NT^p$.

Using a 'p' larger than 1 can be used in TCM encoder 24 of FIG. 1. In such embodiments, TCM scheme 48 specifies intermediate transitions from S(n) to S(n+p). Upon receiving a chunk of Nb input bits, SM 56 passes through the states between S(n) and S(n+P) before receiving another chunk of Nb input bits.

The embodiments described above are given by way of example, and other suitable embodiments can also be used. For example, although the described embodiments refer mainly to generating TCM schemes for certain example PR channels, the embodiments are similarly applicable to other PR channels that can be modeled using a suitable linear FIR filter. As another example, although the embodiments refer mainly to symbols of a PAM scheme, other suitable modulation schemes can also be used. For example, the disclosed embodiments are similarly applicable to modulation schemes such as the Quadrature Amplitude Modulation (QAM) scheme and Phase-shift keying (PSK) scheme.

Although the embodiments described herein mainly address generation of TCM schemes for PR channels in general, the methods and systems described herein can also be used in applications, such as in wired and wireless data communication over a PR channel.

It will be appreciated that the embodiments described above are cited by way of example, and that the following claims are not limited to what has been particularly shown and described hereinabove. Rather, the scope includes both combinations and sub-combinations of the various features described hereinabove, as well as variations and modifications thereof which would occur to persons skilled in the art upon reading the foregoing description and which are not disclosed in the prior art. Documents incorporated by reference in the present patent application are to be considered an integral part of the application except that to the extent any terms are defined in these incorporated documents in a manner that conflicts with the definitions made explicitly or implicitly in the present specification, only the definitions in the present specification should be considered.

The invention claimed is:

1. A method for generating a Trellis-Coded Modulation (TCM) scheme for transmitting symbols over a Partial-Response (PR) channel, the method comprising:

holding a base TCM scheme comprising a plurality of states and transitions among the states;

producing multiple first sequences of symbols, and calculating respective second sequences of symbols, each second sequence of symbols emulating a response of the PR channel to a respective first sequence of symbols traversing the PR channel;

initializing the TCM scheme by assigning the first sequences of symbols to the transitions of the base TCM scheme;

removing one or more of the transitions from the TCM scheme in a manner that remaining second sequences from among the second sequences of symbols, the remaining second sequences corresponding to transitions that were not removed, are separated from one another by at least a specified first distance; and further removing, from among the transitions of the TCM scheme, one or more additional transitions, in a manner that a plurality of sequences from among the remaining second sequences of symbols, the plurality corresponding to transitions from a current state to a next state, are separated from one another by at least a specified second distance larger than the first distance.

2. The method according to claim 1, wherein holding the base TCM scheme comprises selecting a number of the states in the plurality of states based on an underlying modulation scheme and on a memory length parameter of the channel.

3. The method according to claim 1, wherein the first sequences of symbols have a predefined number of symbols that is equal to or larger than a memory length parameter of the channel.

4. The method according to claim 1, wherein the first sequences of symbols have symbols of a modulation scheme selected from a list comprising: a Pulse Amplitude Modulation (PAM) scheme, a Quadrature Amplitude Modulation (QAM) scheme, and a Phase-shift keying (PSK) scheme.

5. The method according to claim 1, wherein calculating the first distance and the second distance comprises calculating a Euclidian distance accumulated over individual symbols of relevant second sequences.

6. The method according to claim 1, wherein removing the additional transitions comprises identifying first sequences of symbols associated with parallel transitions from a given current state to a given next state, and removing one or more transitions corresponding to the identified first sequences of symbols.

7. The method according to claim 6, wherein identifying the first sequences of symbols comprises identifying the second sequences of symbols sharing a same initial subsequence of symbols indicative of the given current state, and a same subsequence of last symbols indicative of the given next state.

8. The method according to claim 1, and comprising including in the TCM scheme one or more additional states and multiple additional transitions, each additional transition satisfying one or both of following conditions: (i) the additional transition being egressed from one of the states or from an additional state, and (ii) the additional transition being ended at one of the states or at an additional state.

9. The method according to claim 8, and comprising assigning to the additional transitions first sequences of symbols associated with transitions that have been removed, in a manner that the second sequences of symbols corresponding to non-parallel additional transitions and to parallel additional transitions are separated by at least the first distance and the second distance, respectively.

10. The method according to claim 1, and comprising determining a number of input bits to be assigned per transition, based on a minimal number among numbers of egressing transitions from respective states of the TCM scheme.

11. An apparatus for generating a Trellis-Coded Modulation (TCM) scheme for transmitting symbols over a Partial-Response (PR) channel, the apparatus comprising:

a memory, configured to hold a base TCM scheme comprising a plurality of states and transitions among the states; and a processor, configured to:

produce multiple first sequences of symbols, and calculate respective second sequences of symbols, each second sequence of symbols emulating a response of the PR channel to a respective first sequence of symbols traversing the PR channel;

initialize the TCM scheme, in the memory, by assigning the first sequences of symbols to the transitions of the base TCM scheme;

remove one or more of the transitions from the TCM scheme in a manner that remaining second sequences from among the second sequences of symbols, the remaining second sequences corresponding to transitions that were not removed, are separated from one another by at least a specified first distance; and further remove, from among the transitions of the TCM scheme, one or more additional transitions, in a manner that a plurality of sequences from among the remaining second sequences of symbols, the plurality corresponding to transitions from a current state to a next state, are separated from one another by at least a specified second distance larger than the first distance.

12. The apparatus according to claim 11, wherein the processor is configured to hold the base TCM scheme by selecting a number of the states in the plurality of states based on an underlying modulation scheme and on a memory length parameter of the channel.

13. The apparatus according to claim 11, wherein the first sequences of symbols have a predefined number of symbols that is equal to or larger than a memory length parameter of the channel.

14. The apparatus according to claim 11, wherein the first sequences of symbols have symbols of a modulation scheme selected from a list comprising: a Pulse Amplitude Modulation (PAM) scheme, a Quadrature Amplitude Modulation (QAM) scheme, and a Phase-shift keying (PSK) scheme.

15. The apparatus according to claim 11, wherein the processor is configured to calculate the first distance and the second distance by calculating a Euclidian distance accumulated over individual symbols of relevant second sequences.

16. The apparatus according to claim 11, wherein the processor is configured to remove the additional transitions by identifying first sequences of symbols associated with parallel transitions from a given current state to a given next state, and removing one or more transitions corresponding to the identified first sequences of symbols.

17. The apparatus according to claim 16, wherein the processor is configured to identify the first sequences of symbols by identifying the second sequences of symbols sharing a same initial subsequence of symbols indicative of the given current state, and a same subsequence of last symbols indicative of the given next state.

18. The apparatus according to claim 11, wherein the processor is configured to include in the TCM scheme one or more additional states and multiple additional transitions, each additional transition satisfying one or both of following conditions: (i) the additional transition being egressed from one of the states or from an additional state, and (ii) the additional transition being ended at one of the states or at an additional state.

19. The apparatus according to claim 18, wherein the processor is configured to assign to the additional transitions first sequences of symbols associated with transitions that have been removed, in a manner that the second sequences of symbols corresponding to non-parallel additional transitions and to parallel additional transitions are separated by at least the first distance and the second distance, respectively.

20. The apparatus according to claim 11, wherein the processor is configured to determine a number of input bits to be assigned per transition, based on a minimal number among numbers of egressing transitions from respective states of the TCM scheme.

21. A computer software product for generating a Trellis-Coded Modulation (TCM) scheme for transmitting symbols over a Partial-Response (PR) channel, the product comprising a tangible non-transitory computer-readable medium in which program instructions are stored, which instructions, when read by a processor of a computing system, cause the processor to hold in a memory of the computing system a base TCM scheme comprising a plurality of states and transitions among the states, to produce multiple first sequences of symbols, and calculate respective second sequences of symbols, each second sequence of symbols emulating a response of the PR channel to a respective first sequence of symbols traversing the PR channel, to initialize the TCM scheme, in the memory, by assigning the first sequences of symbols to the transitions of the base TCM scheme, to remove one or more of the transitions from the TCM scheme in a manner that remaining second sequences from among the second sequences of symbols, the remaining second sequences corresponding to transitions that were not removed, are separated from one another by at least a specified first distance, and to further remove, from among the transitions of the TCM scheme, one or more additional transitions, in a manner that a plurality of sequences from among the remaining second sequences of symbols, the plurality corresponding to transitions from a current state to a next state, are separated by at least a specified second distance larger than the first distance.

\* \* \* \* \*